United States Patent
Park

(10) Patent No.: US 8,815,421 B2
(45) Date of Patent: Aug. 26, 2014

(54) PRINTED CIRCUIT BOARD AND BATTERY PACK USING THE SAME

(75) Inventor: Jin-Sung Park, Yongin-si (KR)

(73) Assignee: Samsung SDI Co., Ltd., Yongin-si, Gyeonggi-do (KR)

(*) Notice: Subject to any disclaimer, the term of this patent is extended or adjusted under 35 U.S.C. 154(b) by 142 days.

(21) Appl. No.: 13/137,790

(22) Filed: Sep. 13, 2011

(65) Prior Publication Data

US 2012/0129011 A1    May 24, 2012

(30) Foreign Application Priority Data

Nov. 19, 2010  (KR) .................. 10-2010-0115563

(51) Int. Cl.
*H01M 10/42* (2006.01)
(52) U.S. Cl.
USPC .............................. 429/7; 174/262
(58) Field of Classification Search
CPC .................................... H05K 1/115
USPC .............................. 429/7; 174/262
See application file for complete search history.

(56) References Cited

U.S. PATENT DOCUMENTS

| | | | |
|---|---|---|---|
| 3,351,816 A * | 11/1967 | Sear et al. ............ | 361/795 |
| 7,365,274 B2 | 4/2008 | Miya et al. | |
| 2003/0077486 A1 * | 4/2003 | Iwaizono et al. ...... | 429/7 |
| 2009/0085518 A1 | 4/2009 | Hong et al. | |
| 2009/0246611 A1 | 10/2009 | Kim | |
| 2010/0178549 A1 | 7/2010 | Moom | |

FOREIGN PATENT DOCUMENTS

| | | |
|---|---|---|
| KR | 1998-0007891 A | 3/1998 |
| KR | 10-2001-0056041 A | 4/2001 |
| KR | 10-2006-0086848 A | 8/2006 |
| KR | 10-2007-0102095 A | 10/2007 |
| KR | 10-0867928 B1 | 11/2008 |
| KR | 10-2009-0103427 A | 10/2009 |
| KR | 10 2010-0082530 A | 7/2010 |

OTHER PUBLICATIONS

Korean Notice of Allowance in KR 10-2010-0115563, dated Oct. 31, 2012 (Park).
Korean Office Action in KR 10-2010-0115563, dated Apr. 13, 2012 (Park).

* cited by examiner

*Primary Examiner* — Nicholas P D'Aniello
(74) *Attorney, Agent, or Firm* — Lee & Morse, P.C.

(57) ABSTRACT

A printed circuit board includes a base substrate, at least one through-hole in the base substrate, a connection tab extending through the through-hole, an electrical element on the base substrate and adjacent to the through-hole, and at least one groove portion in the base substrate and adjacent to the electrical element.

18 Claims, 3 Drawing Sheets

PRINTED CIRCUIT BOARD AND BATTERY PACK USING THE SAME

BACKGROUND

1. Field

An aspect of example embodiments relates to a printed circuit board and a battery pack using the same, and more particularly, to a printed circuit board with an improved quality and a battery pack using the same.

2. Description of the Related Art

In general, various electronic components may be mounted on a printed circuit board. These electronic components may be connected to the printed circuit board by a plurality of electrode terminals. Recently, as electronic components have been developed to become lighter, thinner, and smaller, electrode terminals connected to printed circuit boards having the electronic components mounted thereon may be formed with a narrow pitch.

SUMMARY

Embodiments are therefore directed to a printed circuit board and a battery pack using the same, which substantially overcome one or more of the problems due to the limitations and disadvantages of the related art.

It is therefore a feature of an embodiment to provide a circuit board with a groove portion to facilitate deposition of a fixing member connecting a connection-tab in a through-hole and an electric component adjacent to the groove portion, thereby preventing the fixing member from overflowing and causing connection defects.

It is therefore another feature of an embodiment to provide a battery pack using a circuit board with a groove portion to facilitate deposition of a fixing member connecting a connection-tab in a through-hole and an electric component adjacent to the groove portion, thereby preventing the fixing member from overflowing and causing connection defects.

At least one of the above and other features and advantages may be realized by providing a printed circuit board, including a base substrate having a circuit portion mounted thereon, at least one through-hole formed on the base substrate, a connection tab extending through the through-hole, an electrical element adjacent to the through-hole, and at least one groove portion in the base substrate and adjacent to the electrical element.

The printed circuit board may further include a fixing member in the groove portion, the fixing member connecting the electrical element to the connection tab. The fixing member may include a solder. The fixing member may fill the groove portion.

The electrical element may be on a bottom of the groove portion, the base substrate overlapping at least two perpendicular surfaces of the electrical element.

The groove portion and the through-hole may be concentric.

The groove portion may be between the electrical element and the connection tab. The groove portion may be inclined. The groove portion may be gradually inclined downward from a side adjacent to the connection tab to a side of the electrical element. The connection tab may have a bent shape, a portion of the connection tab being in the groove portion.

The groove portion may be continuous along a circumference of the through-hole. The groove may be external to the electrical element. The groove portion may be continuous along an outermost circumference of the electrical element.

At least one of the above and other features and advantages may also be realized by providing a battery pack, including a printed circuit board having at least one through-hole in a base substrate, an electrical element on the base substrate and adjacent to the through-hole, and at least one groove portion in the base substrate and adjacent to the electrical element, a connection tab extending through the through-hole of the printed circuit board to electrically connect to the electrical element of the printed circuit board by a fixing member, and at least one bare cell connected to the connection tab, the bare cell and electrical element being on opposite ends of the connection tab.

The fixing member may include a solder. The groove portion may be in a surface of the base substrate that faces away from the bare cell. The groove portion may extend from an outer surface of the base substrate toward the bare cell, a portion of the base substrate being between the groove portion and the bare cell.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
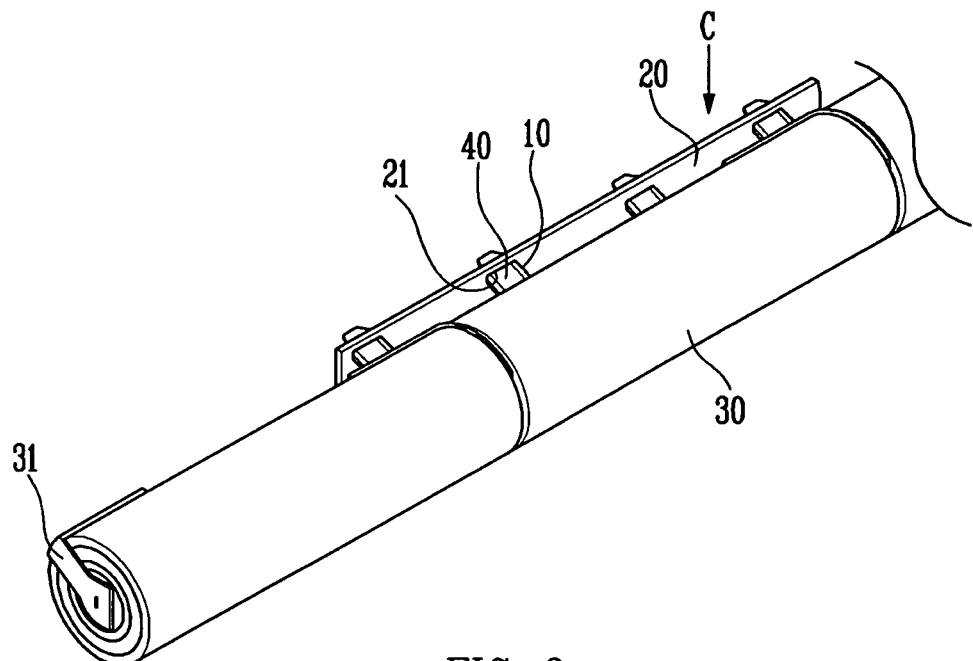
FIG. 1 illustrates a perspective view of a battery pack according to an embodiment.

Korean Patent Application No. 10-2010-0115563, filed on Nov. 19, 2010, in the Korean Intellectual Property Office, and entitled: "Printed Circuit Board and Battery Pack Using the Same" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "on" another element or substrate, it can be directly on the other element or substrate, or intervening elements may also be present. Further, it will be understood that when an element is referred to as being "connected to" another element, they can be directly connected, or one or more intervening elements may also be present. In addition, it will also be understood that when an element is referred to as being "between" two elements, it can be the only element between the two elements, or one or more intervening elements may also be present. Like reference numerals refer to like elements throughout.

FIG. 1 illustrates a perspective view of a battery pack according to an example embodiment. Referring to FIG. 1, a printed circuit board according to an example embodiment may be provided with a base substrate 20 having a circuit portion mounted thereon. For example, a printed circuit board C may include a pattern 22 (FIG. 2) on the substrate 20, so the pattern 22, e.g., a circuit portion, may be connected to a bare cell 30 of a battery via a connection tab 40 of the battery.

In detail, the connection tab 40 may be connected between the base substrate 20 and the bare cell 30, e.g., a cylindrical bare cell 30. That is, one side of the connection tab 40 may be connected to the base substrate 20 of the printed circuit C, and an opposite side of the connection tab 40 may be connected to the bare cell 30. In this instance, a connection-tab through-hole 21 may be formed in the base substrate 20, i.e., through the base substrate 20, so one side of the connection tab 40 may pass through the connection-tab through-hole 21. The connection tab 40 is inserted into the connection-tab through-hole 21 and then soldered to the base substrate 20, so that the connection tab 40 and the base substrate 20 may be fixed to each other. The connection tab 40 may be connected to an outer surface of the base substrate 20, i.e., a surface of the base substrate facing away from the bare cell 30. Accordingly, the bare cell 30 may be electrically connected to the base substrate 20 through the connection tab 40.

Here, the printed circuit board may include a protection circuit module provided to the battery pack. Hereinafter, the printed circuit board is referred to as a protection circuit module, but is not limited thereto.

As illustrated in FIG. 1, an insulating member 10 may be formed on an outer surface of the connection tab 40. The insulating member 10 may be formed in a region of the connection tab 40 that is adjacent to the bare cell 30 but not in a region corresponding to the connection-tab through-hole 21 or in a region of the connection tab 40 extracted to the exterior of the base substrate 20 through the connection-tab through-hole 21. In other words, the insulating member 10 may be formed, e.g., only, on a portion of the connection tab 40 that is between the base substrate 20 and the bare cell 30, e.g., so a portion of the connection tab 40 inside the connection-tab through-hole 21 and extending away from the bare cell 30 and the outer surface of the base substrate 20 may not be covered by the insulating member 10. Accordingly, the connection tab 40 extracted to the exterior of the base substrate 20 through the connection-tab through-hole 21 may be electrically connected to the base substrate 20 of the protection circuit module through soldering. For example, the insulating member 10 may be formed of a polyimide (PI) film.

The protection circuit module may include a base substrate, electronic components mounted on the base substrate, and the like. The protection circuit module may control current by detecting overcharge of batteries, overdischarge of batteries, or the like. At least one connection-tab through-hole 21 into which the one side of the connection tab 40 is inserted may be formed in the base substrate 20.

Figure 2:
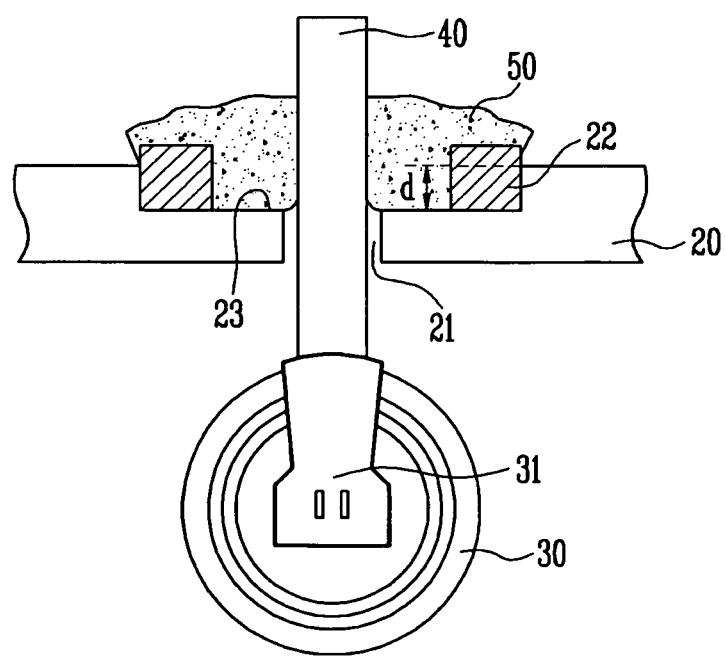
FIG. 2 illustrates a side view of a battery pack according to an embodiment.

FIG. 2 illustrates an enlarged side view of a battery pack according to an embodiment. As illustrated in FIG. 2, the pattern 22 may be formed at a position adjacent to the connection-tab through-hole 21 in the base substrate 20 of the protection circuit module. As further illustrated in FIG. 2, at least one groove portion 23 may be formed at a position adjacent to the pattern 22. In this instance, the groove portion 23 is a space in which a fixing member may be accommodated, so that the connection tab 40 may be electrically connected to the pattern 22 formed in the base substrate 20 of the protection circuit module. For example, the fixing member may be a solder. Hereinafter, the term "solder" will be used as the fixing member for convenience of illustration. The pattern 22 and the groove portion 23 will be described in detail with reference to FIGS. 2 to 6.

One or more bare cells 30 may be formed into a structure in which they are connected in series or parallel to one another. For example, terminal tabs 31 may be welded and fixed between the respective bare cells 30 and at ends of the outermost bare cells 30. Thus, the one or more bare cells 30 may be electrically connected to one another by the terminal tabs 31 positioned between the respective bare cells 30.

Referring to FIG. 2, the connection-tab through-hole 21 may be formed in the base substrate 20 of the protection circuit module, and the connection tab 40 may pass through the connection-tab through-hole 21. The pattern 22 may be formed to be spaced apart from the connection-tab through-hole 21 at a predetermined interval. For example, the pattern 22 may be an electrical element, i.e., component, that connects an electronic component to the connection tab 40. In another example, the pattern 22 may be a portion of a circuit.

The groove portion 23 may be formed adjacent to the pattern 22, e.g., the groove portion 23 may define a space between the pattern 22 and the connection tab 40. That is, the groove portion 23 may be continuously formed along a circumference of the connection-tab through-hole 21, e.g., a portion of the base substrate 20 may be removed from the outer surface thereof to a predetermined depth in a region surrounding the connection tab 40. The groove portion 23 is a space in which a solder that connects the pattern 22 to the connection tab 40 may be accommodated.

More specifically, soldering is performed when the connection tab 40 is fixed to the base substrate 20 of the protection circuit module. In this instance, a solder 50 enables the connection tab 40 and the pattern 22 to be electrically connected to each other. Here, the solder 50 is accommodated in the groove portion 23 between the pattern 22 and the connection tab 40 and prevents mountains of lead from being formed around the connection tab 40. For example, the solder 50 may directly contact the pattern 22, the base substrate 20, and the connection tab 40 to completely fill the groove 23. Accordingly, a failure rate may be decreased by removing the formation of the mountains of lead, so that the quality of products can be improved.

The groove portion 23 may be formed to have a depth d that is less than ½ of the thickness of the base substrate 20 of the protection circuit module. For example, a portion of the pattern 22 may be positioned in the groove 23, e.g., only a portion of the pattern 22 may extend above the outer surface of the base substrate 20, to increase stability of the pattern 22 on the base substrate 20 and its connection to the connection tab 40. It is noted that the depth d and the thickness of the substrate 20 are measured from the outer surface of the base substrate 20 toward the bare cell 30 along a direction normal to the outer surface of the base substrate 20. In a case where the groove portion 23 is formed to have a depth that exceeds ½ of the thickness of the base substrate 20 of the protection circuit module, the base substrate 20 of the protection circuit module may have insufficient bearing power.

Figure 3:
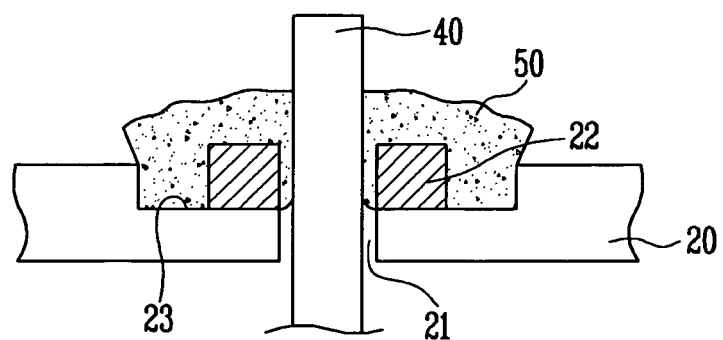
FIG. 3 illustrates a side view of a battery pack according to another embodiment.

FIG. 3 illustrates a side view of a battery pack according to another embodiment. Referring to FIG. 3, the pattern 22 may be formed adjacent to the connection-tab through-hole 21 formed in the base substrate 20 of the protection circuit module, and the groove portion 23 may be formed at the outside of the pattern 22. That is, the pattern 22 may be positioned on the base substrate 20 between a space defined in the groove portion 23 and the connection tab 40. In this instance, the groove portion 23 may be continuously formed along the outermost circumference of the pattern 22. Thus, the solder 50 may be positioned in the space defined by the groove portion 23 to electrically connect the connection tab 40 to the pattern 22 on the base substrate 20 of the protection circuit module. Accordingly, the fixing member may fit in the groove 23, e.g., mountains of solder may not be formed, the failure rate of products may be decreased.

Figure 4:
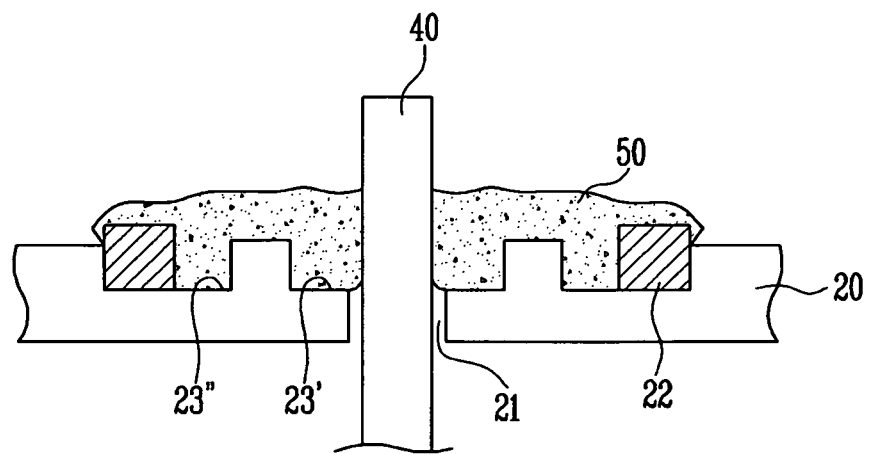
FIG. 4 illustrates a side view of a battery pack according to still another embodiment.

FIG. 4 illustrates a side view of a battery pack according to still another embodiment. Referring to FIG. 4, a first groove portion 23' may be formed along the circumference of the connection-tab through-hole 21 formed in the base substrate 20 of the protection circuit module, and a second groove portion 23" may be formed along the circumference of the first groove portion 23' while being spaced apart from the first groove portion 23' at a predetermined interval. In this instance, the pattern 22 may be formed at an outside of the second groove portion 23". Here, the second groove portion 23" may be a dummy pattern generated in the manufacturing of the base substrate 20 of the protection circuit module or a portion formed intentionally. Therefore, the solder 50 may fill the first and second groove portions 23' and 23".

Since the two groove portions 23' and 23" are formed as described above, a space capable of accommodating the solder 50 may be increased as compared with the aforementioned embodiment, so that it may be possible to accommodate a larger amount of solder. Accordingly, the formation of mountains of solder may be effectively prevented.

Figure 5:
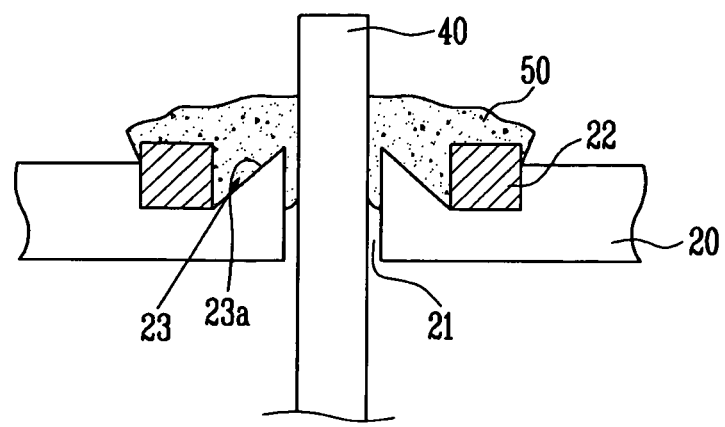
FIG. 5 illustrates a side view of a battery pack according to still another embodiment.

FIG. 5 illustrates a side view of a battery pack according to still another embodiment. Referring to FIG. 5, the groove portion 23 may be formed between the pattern 22 and the connection tab 40. In this instance, the groove portion 23 may be formed to include an inclined portion 23a. More specifically, the groove portion 23 may be formed to be gradually inclined downward to a side of the pattern 22 from a side adjacent to the connection tab 40. For example, a portion removed from the base substrate 20 to define the groove portion 23 may have a cross-section of an inverted triangle. Accordingly, the solder 50 may be well flowed toward the pattern 22, and it may be possible to prevent the solder 50 from being overflowed to surrounding portions.

Figure 6:
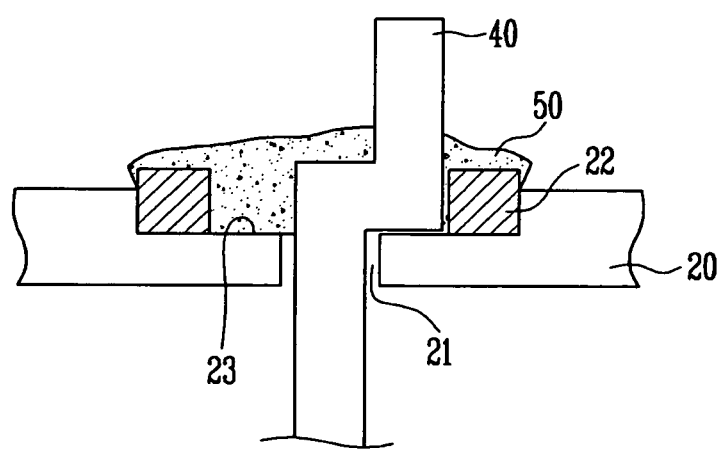
FIG. 6 illustrates a side view of a battery pack according to still another embodiment.

FIG. 6 illustrates a side view of a battery pack according to still another embodiment. Referring to FIG. 6, the groove portion 23 according to this embodiment may be formed adjacent to the pattern 22, e.g., as described previously with reference to FIG. 2, and may be formed between the pattern 22 and the connection tab 40. That is, the groove portion 23 may be continuously formed along the circumference of the connection-tab through-hole 21 so as to accommodate the solder 50. In this instance, the connection tab 40 may be formed in a bent shape to be mounted on the groove portion 23. Thus, it may be possible to prevent the connection tab 40 that passes through the connection-tab through-hole 21 from falling into the side at which the connection tab 40 is inserted into the connection-tab through-hole 21. Accordingly, the process of soldering the connection tab 40 to the base substrate 20 of the protection module may be easily performed.

As described above, according to embodiments, a groove portion may be formed adjacent to a through-hole of a printed circuit board to accommodate a fixing member, e.g., solder, therein. As such, it may be possible to prevent the fixing member from being formed in a mountain shape. Accordingly, a failure rate may be decreased, thereby improving quality of products. In contrast, when electrode terminals are inserted into holes with a narrow pitch in the printed circuit board and then connected to the printed circuit board by a fixing member deposited on a substrate without a groove therein, an excessive amount of, e.g., melted, fixing member may be formed on the substrate, e.g., in a mountain shape on the printed circuit board, thereby causing potential failure or causing overflow of the fixing member toward adjacent electrode terminals to trigger a short circuit therebetween.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A printed circuit board, comprising:
a base substrate including a first outer surface and a second outer surface defining a thickness of the base substrate;
at least one through-hole in the base substrate, the through-hole extending to and open to the second outer surface;
a connection tab extending through the through-hole;
an electrical element on the base substrate and adjacent to the through-hole; and
at least one groove portion including a bottom surface in the base substrate, extending from the bottom surface to the first outer surface to define a depth, open to the first outer surface, and adjacent to the electrical element, the electrical element being on the bottom surface, the groove portion being continuous along an entire circumference of the through-hole, and the depth of the at least one groove being less than the thickness of the base substrate.

2. The printed circuit board as claimed in claim 1, further comprising a fixing member in the groove portion, the fixing member electrically connecting the electrical element to the connection tab.

3. The printed circuit board as claimed in claim 2, wherein the fixing member includes a solder.

4. The printed circuit board as claimed in claim 2, wherein the fixing member fills the groove portion and surrounds the entire connection tab.

5. The printed circuit board as claimed in claim 2, wherein the electrical element is spaced apart from the connection tab, the base substrate overlapping at least two perpendicular surfaces of the electrical element, and the groove portion defining a space for the fixing member between the electrical element and the connection tab.

6. The printed circuit board as claimed in claim 1, wherein the groove portion and the through-hole are concentric.

7. The printed circuit board as claimed in claim 1, wherein the groove portion is between the electrical element and the connection tab.

8. The printed circuit board as claimed in claim 7, wherein the groove portion is inclined.

9. The printed circuit board as claimed in claim 8, wherein the groove portion is gradually inclined downward from a side adjacent to the connection tab to a side of the electrical element.

10. The printed circuit board as claimed in claim 7, wherein the connection tab has a bent shape, a portion of the connection tab being in the groove portion.

11. The printed circuit board as claimed in claim 1, wherein the groove portion is external to the electrical element.

12. The printed circuit board as claimed in claim 11, wherein the groove portion is continuous along an outermost circumference of the electrical element.

13. A battery pack, comprising:
- a printed circuit board including at least one through-hole in a base substrate, an electrical element on the base substrate and adjacent to the through-hole, and at least one groove portion in the base substrate and adjacent to the electrical element;
- a connection tab extending through the through-hole of the printed circuit board to electrically connect to the electrical element of the printed circuit board by a fixing member; and
- at least one bare cell connected to the connection tab, the bare cell and electrical element being on opposite ends of the connection tab;
- wherein the groove portion includes a bottom surface in the base substrate, and the electrical element is on the bottom surface.

14. The battery pack as claimed in claim 13, wherein the fixing member includes a solder.

15. The battery pack as claimed in claim 13, wherein the groove portion is in a surface of the base substrate that faces away from the bare cell, the electrical element being an electrical pattern in the groove portion.

16. The battery pack as claimed in claim 15, wherein the groove portion extends from an outer surface of the base substrate toward the bare cell, a portion of the base substrate being between the groove portion and the bare cell.

17. The battery pack as claimed in claim 13, wherein the base substrate includes a first outer surface and a second outer surface defining a thickness of the base substrate, the through-hole extends to and is open to the second outer surface, the groove portion extends from the bottom surface to the first outer surface to define a depth, the groove portion being open to the first outer surface, and the groove portion depth being less than the base substrate thickness.

18. The battery pack as claimed in claim 13, wherein the fixing member is a solder and completely fills the groove portion except for the connection tab, the electrical element, and the through-hole.

* * * * *